United States Patent

Takahashi et al.

[11] 4,097,266
[45] Jun. 27, 1978

[54] MICROSPHERE OF SOLDER HAVING A METALLIC CORE AND PRODUCTION THEREOF

[75] Inventors: Eikichi Takahashi, Matsudo; Toshihiko Taguchi, Showa; Kazuo Fujikura, Mooka; Toshihisa Sudo, Tokyo, all of Japan

[73] Assignee: Senju Metal Industry Co., Ltd., Tokyo, Japan

[21] Appl. No.: 645,395

[22] Filed: Dec. 30, 1975

[30] Foreign Application Priority Data

Jan. 24, 1975  Japan ................................. 50-10223

[51] Int. Cl.² ............................................. B22D 23/08
[52] U.S. Cl. .................. 75/0.5 R; 75/0.5 B; 148/24; 264/7; 428/570
[58] Field of Search ................ 75/0.5 B, 0.5 C, 0.5 R; 148/24; 264/5, 7

[56] References Cited

U.S. PATENT DOCUMENTS

| | | | |
|---|---|---|---|
| 2,815,729 | 12/1957 | Goodman | 113/110 |
| 3,303,393 | 2/1967 | Hymes | 317/101 |
| 3,703,254 | 11/1972 | Maierson | 148/24 |

*Primary Examiner*—P. D. Rosenberg
*Attorney, Agent, or Firm*—Stevens, Davis, Miller & Mosher

[57] ABSTRACT

A microsphere of solder having a metallic core, in which the thickness of the solder coating of the microsphere is more than 20 microns, can be produced by a process comprising preparing a sheet having a plurality of hollows provided all over the sheet, placing a spherical grain of a metal together with at least one grain of solder in each of said hollows, the metallic grain having wettability for solder, then heating the grains in the hollow in the presence of a flux to coat the metallic grain with the solder, and recovering a spherical solder bead having a metallic core.

16 Claims, 9 Drawing Figures

X 30

X 130

MICROSPHERE OF SOLDER HAVING A METALLIC CORE AND PRODUCTION THEREOF

Field of the Invention

The present invention relates to a microsphere of solder having a metallic core, and to the production thereof. More particularly, the present invention relates to a microsphere of solder having a metallic core, which is used for soldering operations required in connecting integrated circuits etc.

DESCRIPTION OF THE PRIOR ART

U.S. Pat. No. 3,303,393, for example, discloses the connection between a microminiaturized circuit element and a circuit panel using a spherical terminal element, such as a spheroid of copper. The connection of the terminals with solder, however, was not successful in practice, since it is difficult to supply solder in the very small, but precisely controlled amount which is required to connect the circuit element and terminal.

In the prior art it has been proposed to electroplate copper or silver grains with solder prior to placing the copper or silver grain between a micro-sized circuit element and a terminal. For this purpose, electro-barrel plating has been employed. The thickness of solder coating thus obtained, however, is 10 – 20 microns at the most. It is impossible to apply a solder coating more than 20 microns thick by this prior art technique. Thus, an additional amount of solder has to be supplied to the connection during soldering of the element and terminal, and it is very difficult to precisely control the amount of additional solder to be supplied.

On the other hand, a recent development in the field of micro-electronics makes essential the easy soldering of micro-sized elements of micro-electronic instruments, and this can be accomplished by using a minute sphere of a metal such as copper and silver having a relatively thick coating of solder.

The inventors of the present invention had disclosed in Japanese Patent Application No. 45062/1974 filed on Apr. 23, 1974 a process for the production of a microsphere of solder having a metallic core, in which, as the first step, a grain of a metal such as copper, silver or alloy thereof is placed in each of the hollows provided in a sheet, paste solder containing a flux therein is supplied to each of the hollows, and then the metallic grain and paste solder are heated to an elevated temperature to provide a microsphere of solder having a metallic core.

However, according to this process it is difficult to supply a predetermined amount of the paste solder to each of the hollows in a precisely controlled manner. Thus, the thickness of the solder coating covering the spherical surface of the metal grain cannot be precisely controlled. Supplying the paste solder with a pallet unavoidably brings about wearing of edges of the hollows. This, in turn, results in increase of size of the hollow. The supply of a given amount of solder cannot be expected by this process.

SUMMRY OF THE INVENTION

An object of the present invention is to provide a microsphere of solder having a metallic core, in which the thickness of the solder coating is more than 20 microns.

Another object of the present invention is to provide a process for efficiently producing a microsphere of solder having a metallic core in a high yield.

A further object of the present invention is to provide a mass production process for producing a microsphere of solder having a metallic core.

Thus, the present invention provides a process for producing a microsphere of solder having a metallic core, comprising preparing a predetermined number of grains of solder and a spherical grain of a metal, heating the grains in the presence of a flux at a temperature higher than the melting point of the solder but lower than the melting point of the metallic core grain to envelop the metallic grain with a coating of solder.

The present invention, in one aspect, provides a process for producing a microsphere of solder having a metallic core, comprising preparing a sheet having a plurality of bowl-like hollows provided all over the sheet, placing a spherical grain of a metal together with a predetermined number of solder grains in each of said hollows, the metallic grain having wettability for solder, then heating the grains in the hollow in the presence of a flux at a temperature higher than the melting point of the solder but lower than the melting point of the metallic core grain to coat the metallic grain with solder, and recovering a spherical solder having a metallic core.

The present invention, in another aspect, provides a process for producing a microsphere of solder having a metallic core, comprising preparing a base sheet provided with a plurality of hollows, placing a second sheet provided with a plurality of holes on the base sheet, the hollows of which are aligned with the holes, the second sheet being slidable on said base sheet in at least one direction, moving the second sheet slightly on said base sheet to close the holes with the base sheet, placing a spherical grain of a metal in each of the holes, restoring the sheet to its initial position to let one grain fall into each of the hollows, again moving the second sheet slightly on said base sheet in one direction to close the holes with the base sheet, placing at least one solder grain in each of the holes, restoring the sheet to its initial position to let the one or more solder grains fall into each of said hollows, removing the second sheet from the base sheet to recover the base sheet containing at least one each of the metallic grains and solder grains in each of the hollows, heating the grains at a temperature higher than the melting point of the solder, but lower than the melting point of the metal of the core grain to envelop the metallic grain with a solder coating.

An intermediate sheet provided with a plurality of holes may be positioned between the base sheet and the second sheet. The holes of the intermediate sheet are also aligned with the hollows of the base sheet and the holes of the second sheet.

According to the present invention, the thickness of solder coating is controlled accurately, since a solder grain having a predetermined diameter is used to coat the metallic grain. As mentioned hereinafter, the thickness may be varied by changing the number of solder grains to be charged into the hollows, or by changing the diameter of the solder grain to be supplied. The coating thus obtained is far thicker than that obtained in the prior art techniques.

In addition, using only a simple apparatus, for the first time practical mass production of spherical solder has become possible in accordance with the present invention.

DESCRIPTION OF THE PREFERRED EMBODIMENT

According to one preferred embodiment of the present invention, a microsphere of solder 0.35 mm in diameter having a spherical core of silver 0.25 mm in diameter is prepared. The thickness of the solder coating, therefore, is about 0.05 mm. The composition of the solder comprises 60% by weight of Sn and 40% by weight of Pb.

Figure 1:
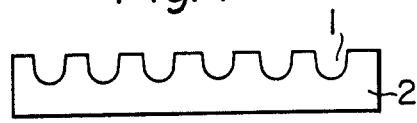
FIG. 1 through FIG. 7 illustrate the steps of producing a microsphere of solder having a metallic core in accordance with the present invention.
Figure 2:
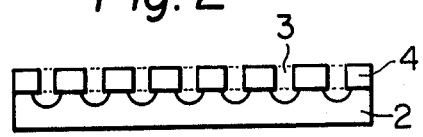
Figure 3:
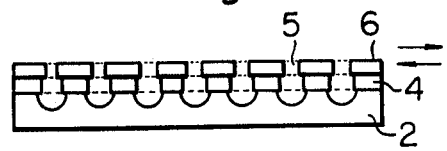

As is illustrated in FIG. 1, the base sheet 2 of aluminum is provided with a plurality of hollows 1 which are 1.5 mm in diameter and 0.8 mm deep. The intermediate sheet 4 of stainless steel 0.2 mm thick provided with holes of 0.55 mm diameter is placed on said aluminum sheet 2. Each of the holes is aligned with its respective hollow in the aluminum sheet (see FIG. 2). Furthermore, the second sheet 6 of stainless steel 0.2 mm thick provided with holes 5 of 0.35 mm diameter is placed on said intermediate sheet 4. The holes of the second sheet 6 are also placed in alignment with the holes in sheet 4 and hollows in sheet 2 (see FIG. 3). The sheet may slightly move on said sheet 4 in at least one direction. The intermediate sheet 4 is not necessarily required for the purpose of the invention. However, said stainless steel sheet 4, when employed, may in fact insure right placement of spherical grains of a metal, such as silver, copper and alloys thereof, and grains of solder in hollows in sheet 2.

The diameters of the hollows in the base sheet 2 and of the holes in the intermediate sheet 4 and the second sheet 6 may vary depending on the diameter of grains of metal and solder to be used and on the thickness of a solder coating desired.

The base sheet 2 may be made of any material which shows no wettability for solder. Generally, the sheet may be made of aluminum, stainless steel, magnesium or ceramics. Aluminum is preferred. The material of the second sheet and the intermediate sheet is not limited to them.

Figure 4:
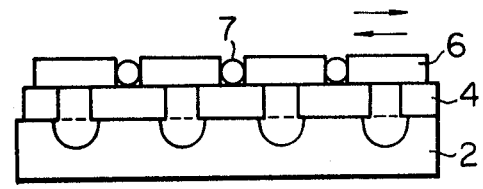

In the production of a microsphere of solder in accordance with the present invention, sheet 4 (if employed) and sheet 6 are placed, in the first place, on sheet 2 with each of the hollows in sheet 2 being in alignment with its respective hole in sheet 4 and sheet 6, and then sheet 6 is slightly moved in one direction, whereby holes 5 are closed with sheet 4 and sheet 2 (see FIG. 4). At this position, spherical grains of a metal such as silver 0.25 mm in diameter are spread over the sheet 6. The assembly of the sheets is then inclined or vibrated, whereby each of the holes 5 is filled with one metallic grain 7. Metallic grains remaining on the sheet are removed with a brush or similar device.

Figure 5:
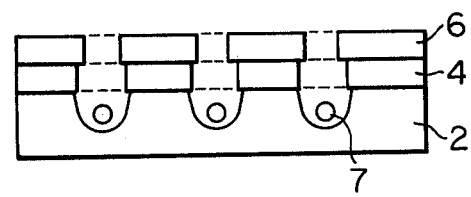

Thereafter, the stainless steel sheet is slid to its initial position, so that each one of the metallic grains 7 falls into a hollow 1 (see FIG. 5).

Figure 6:
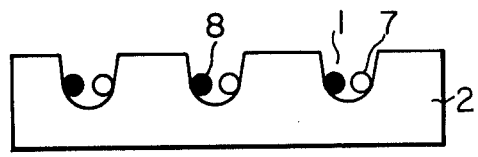

The same procedure is repeated with respect to a solder grain 0.30 mm in diameter. As is illustrated in FIG. 6, one each of metallic grain 7 and solder grain 8 are placed in each of the hollows in the sheet 2.

It should be understood that it is also possible to charge into the hollows in base sheet 2 first the solder grain and then the metallic grain.

At this stage of the production, the sheets 4 and 6 are removed from their position. The recovered sheet 2 contains one metallic grain and one solder grain in each of the hollows. The number of solder grains may be varied depending on the thickness of a solder coating required. If two grains of solder are charged in each of the hollows, the solder coating is thicker than that obtained when using one grain of solder.

Figure 7:
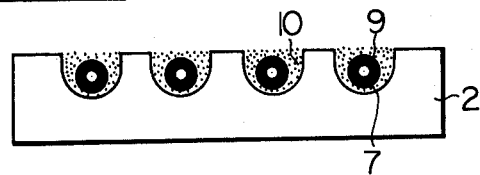

After a flux composition in a liquid phase is sprayed onto the charge in said hollows, the sheet 2 is passed through a furnace or on a solder bath, where sheet 2 is heated at a temperature of about 270° C. The solder is melted and becomes a sphere having a metallic core due to its surface tension (see FIG. 7).

A flux is used in the present invention to assist wetting of a metallic grain for solder. Thus, the flux is not limited to a particular one so long as the flux can assist wettability of the metallic grain for solder. A typical flux to be used in the present invention includes, for example, fluxes containing rosins, organic acids or inorganics. Though it is desirable to spray the flux in a liquid phase on the grains placed in the hollows in a sheet, the flux may be coated onto the inner surface of the hollows with a brush prior to placing the grains in the hollows.

Figure 9:
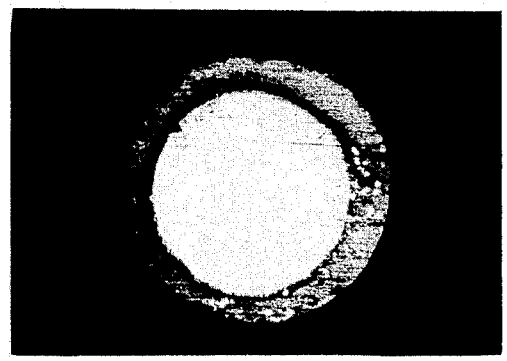
FIG. 9 is a photomicrograph showing a section of the microsphere comprising a metallic core and a solder coating, which is produced in accordance with the present invention.

The reference FIG. 9 indicates a solder coating. The sheet is then cooled and a residual flux 10 is removed by washing with water or a suitable solvent. Thus, the solder sphere having a metallic core is recovered.

Figure 8:
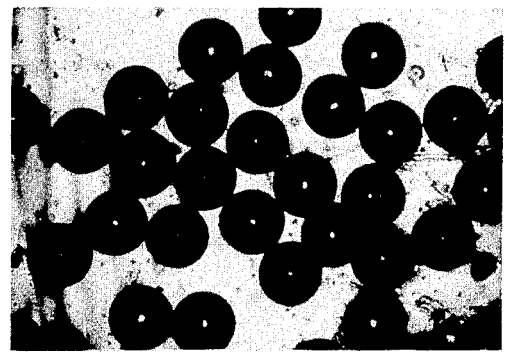
FIG. 8 is a photograph showing the microspheres of solder produced in accordance with the present invention.

FIG. 8 is a photograph showing the spherical appearance of the microspheres obtained by the process of the present invention.

FIG. 9 is a photomicrograph showing a section of the microsphere of solder having a metallic core at a magnification of 130.

The foregoing is an embodiment of the present invention. The present invention is not limited to that embodiment.

The metal of the metallic spherical grain is not limited; it may be any metal having wettability for solder and electrical conductivity. Usually, copper, silver or an alloy thereof is used effectively for this purpose. The copper or silver spherical grains are easily manufactured by atomization in an inert atmosphere.

When it is desirable to inhibit diffusion of the metal, which is used as the spherical grain or core, into solder during a coating process, it is possible to provide a barrier layer around the metallic grain. The layer may be formed with electroless plating of nickel of a thickness of 1 - 2 microns.

Many kinds of solder may be used in the present invention, including, for example, Sn, Pb, Sn—Pb, Sn—Pb—Ag, Sn—Pb—Cd, Pb—Ag, Pb—Sn—In, Pb—In, Sn—In, Pb—Ag—In, which are all easily formed into particles by atomization in an inert atmosphere.

What we claim:

1. A microsphere of solder comprising a metallic core grain and a solder coating thereon, which is prepared by melting at least one solder grain at a temperature higher than the melting point of the solder grain but lower than the melting point of the metallic core grain, and in the presence of the metallic core grain and a flux, to envelop the metallic core grain with a solder coating, the thickness of the solder coating being more than 20 microns.

2. A microsphere of solder comprising a metallic core grain and a solder coating as defined in claim 1, in which the metallic core grain is a spherical grain of a metal having wettability for solder of said solder grain and electrical conductivity.

3. A microsphere of solder comprising a metallic core grain and a solder coating as defined in claim 2, in which the metal of the spherical grain is selected from the group consisting of copper, silver and alloys thereof.

4. A microsphere of solder comprising a metallic core grain and a solder coating as defined in claim 1, in which the solder of said solder coating is selected from the group consisting of Sn, Pb, Sn—Pb, Sn—Pb—Ag, Sn—Pb—Cd, Pb—Ag, Pb—Sn—In, Pb—In, Sn—In and Pb—Ag—In.

5. A process for producing a microsphere of solder comprising a metallic core grain and a solder coating thereon, comprising preparing a predetermined number of solder grains and a metallic core grain, heating the grains in the presence of a flux at a temperature higher than the melting point of the solder grains, but lower than the melting point of the metallic core grain to envelop the metallic grain with a coating of solder.

6. A process for producing a microsphere of solder comprising a metallic core grain and a solder coating as defined in claim 5, in which the metallic core grain is a spherical grain of a metal having wettability for solder of said solder coating and electrical conductivity.

7. A process for producing a microsphere of solder comprising a metallic core grain and a solder coating as defined in claim 5, in which the metal of the spherical grain is selected from the group consisting of copper, silver and alloys thereof.

8. A process for producing a microsphere of solder comprising a metallic core grain and a solder coating as defined in claim 5, in which the solder of said solder coating is selected from the group consisting of Sn, Pb, Sn—Pb, Sn—Pb—Ag, Sn—Pb—Cd, Pb—Ag, Pb—Sn—In, Pb—In, Sn—In and Pb—Ag—In.

9. A process for producing a microsphere of solder comprising a solder coating and a metallic core grain which has a wettability for solder, comprising preparing a sheet having a plurality of bowl-like hollows in an upper surface of the sheet, placing a metallic core grain together with a predetermined number of solder grains in each of said hollows, then heating the grains in the hollow in the presence of a flux at a temperature higher than the melting point of the solder grains, but lower than that of the metal of the metallic core grain to envelop the metallic core grain with a solder coating, and recovering a spherical solder bead having a metallic core grain.

10. A process for producing a microsphere of solder comprising a metallic core and a solder coating as defined in claim 9, in which the metallic core grain is a spherical grain of a metal selected from copper, silver and alloys thereof.

11. A process for producing a microsphere of solder comprising a metallic core grain and a solder coating as defined in claim 9, in which the solder of said solder coating is selected from the group consisting of Sn, Pb, Sn—Pb, Sn—Pb—Ag, Sn—Pb—Cd, Pb—Ag, Pb—Sn—In, Pb—In, Sn—In and Pb—Ag—In.

12. A process for producing a microsphere of solder having a metallic core grain and a solder coating as defined in claim 9, which comprises preparing a base sheet provided with a plurality of said hollows, placing a second sheet provided with a plurality of holes on said base sheet, said hollows being aligned with said holes, said second sheet being slidable on said base sheet in at least one direction, moving the second sheet slightly on said base sheet to close said holes with said base sheet, placing a metallic core grain in each of said holes, restoring said second sheet to its initial position thereby permitting each one of the grains to fall into one of said hollows, again moving said second sheet slightly on said base sheet in one direction to close said holes with said base sheet, placing at least one solder grain in each of said holes, restoring said second sheet to its initial position thereby permitting one or more solder grains to fall into each of said hollows, removing said second sheet from said base sheet to recover said base sheet in which at least one each of the metallic core grains and solder grains are contained in each of said hollows, heating the grains in the presence of a flux at a temperature higher than the melting point of the solder grains but lower than the melting point of the metallic core grain to envelop said metallic core grain with a solder coating.

13. A process for producing a microsphere of solder comprising a metallic core grain as defined in claim 12, in which, as the first step, at least one solder grain is placed in each of said hollows, and then said metallic core grain is placed in each of said hollows.

14. A process for producing a microsphere of solder comprising a metallic core grain as defined in claim 12, in which an intermediate sheet is placed between said base sheet and said second sheet, said intermediate sheet being provided with a plurality of holes, which are aligned with said hollows in the base sheet and holes in the second sheet.

15. The process of claim 5 wherein the surface tension of the molten solder formed by the heating of the solder grains produces a continuous envelop coating of solder entirely covering the surface of the metallic core grain.

16. The process of claim 9, wherein the surface tension of the molten solder formed by the heating of the solder grains produces a continuous envelop coating of solder entirely covering the surface of the metallic core grain.

* * * * *